United States Patent
Woo-nyun

(10) Patent No.: US 7,561,862 B2
(45) Date of Patent: Jul. 14, 2009

(54) AUTOMATIC SELECTION OF COMPENSATION VALUE TO REDUCE IM2 PRODUCT IN MIXED SIGNAL OUTPUT

(75) Inventor: Kim Woo-nyun, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 453 days.

(21) Appl. No.: 11/448,759

(22) Filed: Jun. 8, 2006

(65) Prior Publication Data

US 2007/0042740 A1 Feb. 22, 2007

(30) Foreign Application Priority Data

Aug. 17, 2005 (KR) ...................... 10-2005-0075177

(51) Int. Cl.
*H04B 17/00* (2006.01)
(52) U.S. Cl. .................... 455/226.1; 455/293; 455/295; 455/317
(58) Field of Classification Search .............. 455/226.1, 455/280, 293, 295, 296, 311, 317, 323, 324
See application file for complete search history.

(56) References Cited

U.S. PATENT DOCUMENTS

| 2005/0143044 A1* | 6/2005 | Kim ............................ 455/334 |
| 2005/0159124 A1* | 7/2005 | Shah ........................ 455/226.1 |
| 2006/0234664 A1* | 10/2006 | Chiu et al. ................... 455/285 |
| 2007/0066269 A1* | 3/2007 | Kivekas et al. .............. 455/326 |

* cited by examiner

*Primary Examiner*—Nguyen Vo
(74) *Attorney, Agent, or Firm*—Harness, Dickey & Pierce, P.L.C.

(57) ABSTRACT

An apparatus, for automatically selecting a compensation value usable to reduce a second order intermodulation (IM2) product in an output signal of a mixer, may include: a mixer to output a mixed signal; a detector to detect an product in samples corresponding to the mixed signal; a compensation determination circuit to do the following automatically, to apply a plurality of candidate values of a mixer-control signal to the mixer, the mixer-control signal affecting a magnitude of an IM2 product in the mixed signal, to evaluate samples from the detector corresponding to the plurality, respectively, and to select one among the plurality candidate values as the compensation value.

24 Claims, 11 Drawing Sheets

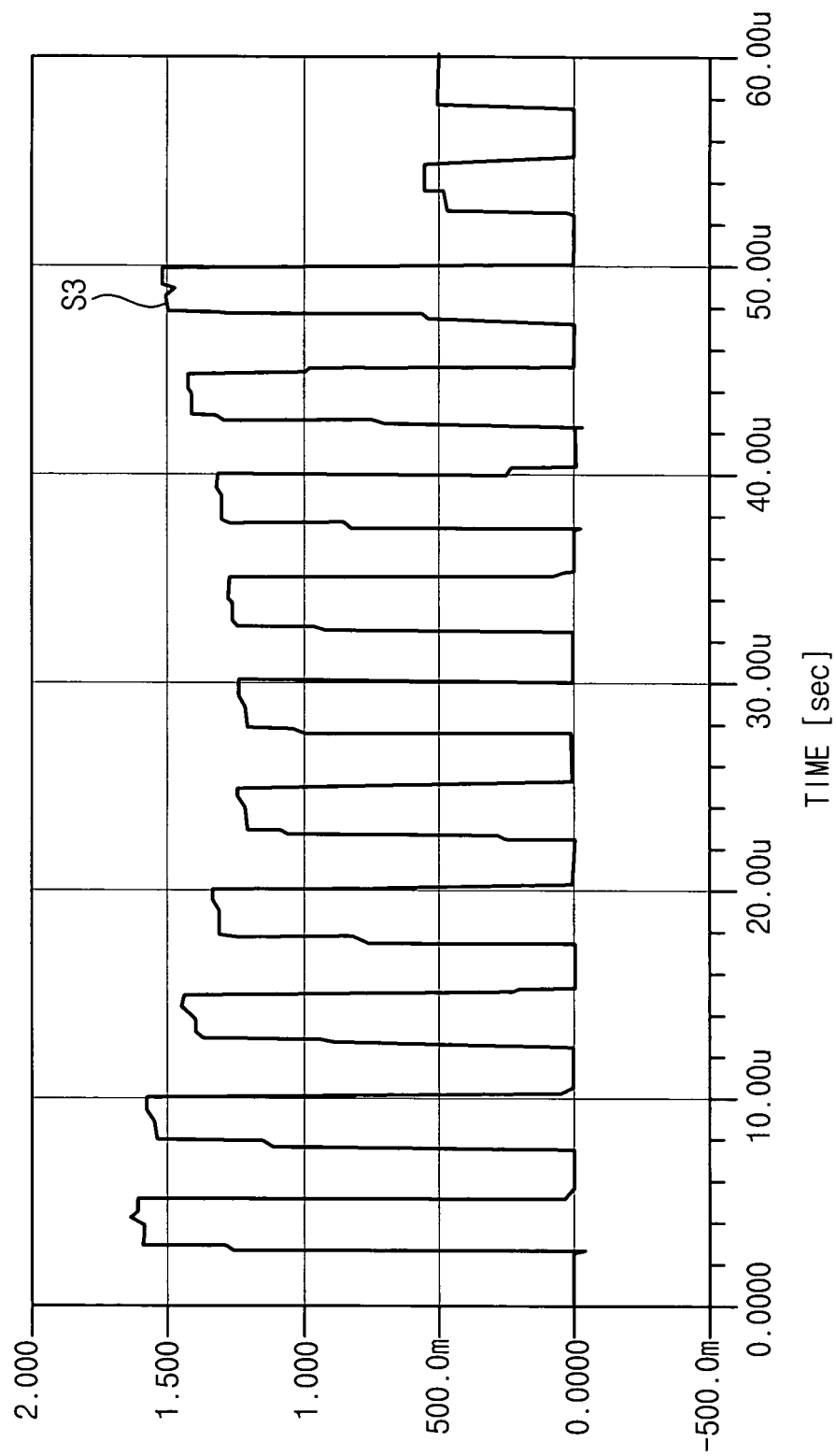

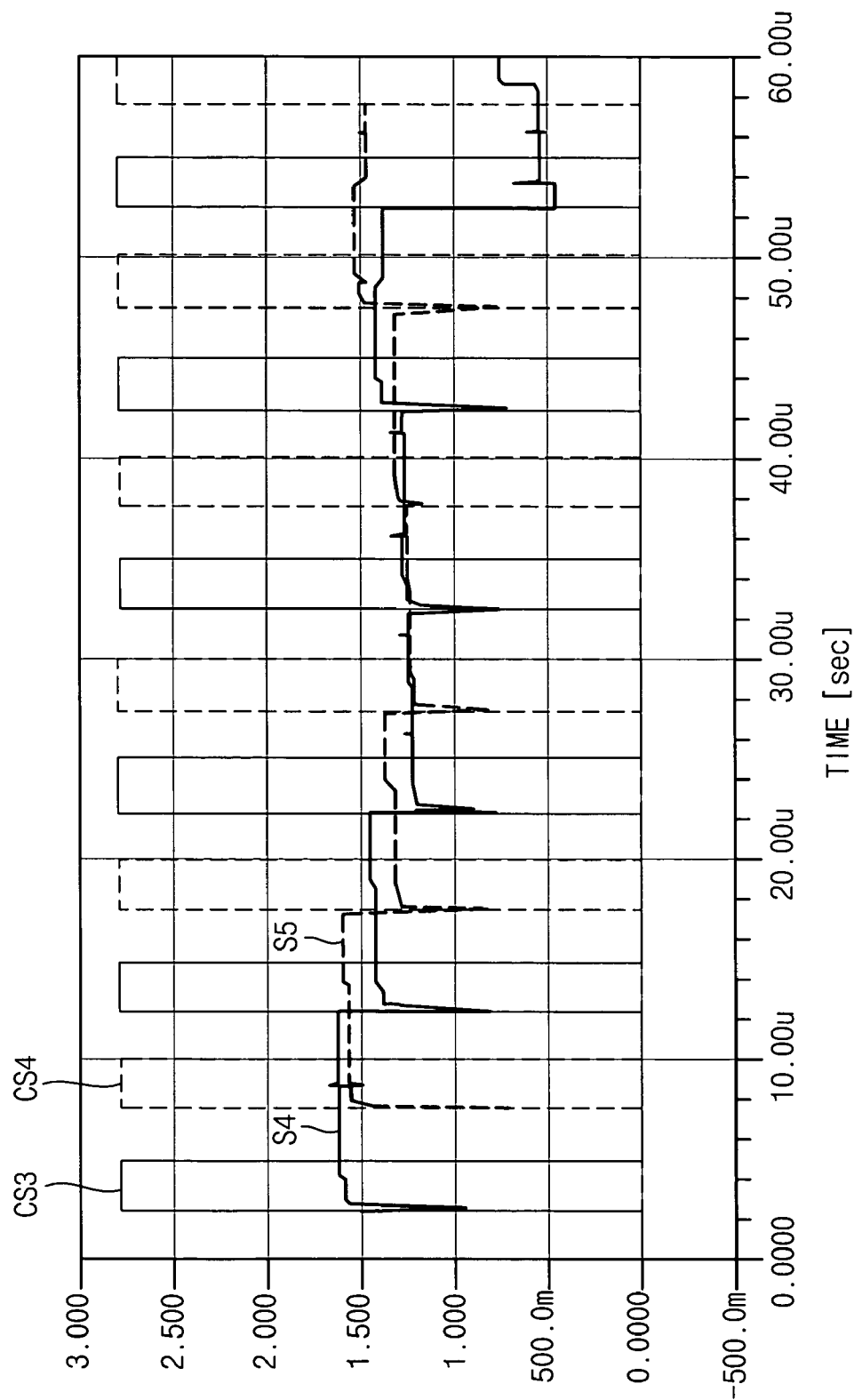

ns occur in radio frequency (RF) transmission/reception
AUTOMATIC SELECTION OF COMPENSATION VALUE TO REDUCE IM2 PRODUCT IN MIXED SIGNAL OUTPUT

BACKGROUND OF THE PRESENT INVENTION

Typical radio frequency (RF) transmission/reception occurs at frequencies that are so high that performing signal processing at such frequencies is considered impractical according to the Background Art. As a result, high frequency signals are received and then translated to the lower frequencies for processing, according to the Background Art.

Historically, the super heterodyne receiver has been the receiver architecture widely accepted and implemented commercially according to the Background Art. In the typical super heterodyne receiver, the received high frequency signals are passed through a first radio frequency (RF) bandpass filter (BPF) to a fixed-gain low noise amplifier (LNA). The amplified signals are passed through a second RF BPF to a first mixer that uses a first local oscillator signal for down-converting (translating) to a fixed intermediate frequency (IF). The resultant IF signals are amplified by a variable gain amplifier (VGA) and then provided to parallel second mixers. In-phase and quadrature (90°) phase versions of a second local oscillator are then provided to the parallel second mixers to downconvert the IF signals into in-phase (I) and quadrature phase (Q) baseband signals.

Over the last few years, the direct-conversion type of receiver architecture has become adopted by the wireless telephony art, primarily for use in handsets. In the typical direct-conversion receiver, the received high frequency signals are passed through a first radio frequency (RF) bandpass filter (BPF) to a fixed-gain LNA. The amplified signals are passed through a second RF BPF and then directly down-converted to in-phase (I) and quadrature phase (Q) baseband signals without an intervening IF mixer stage. The I & Q baseband signals are then passed through parallel lowpass filters (LPFs) to parallel VGAs.

Component mismatches, e.g., due to manufacturing tolerances, etc., in the parallel second mixers and/or the parallel VGAs can produce DC offsets in the I & Q baseband signals. As the headroom of the parallel VGAs is typically limited, a small DC offset can significantly reduce the signal swing or possibly saturate the VGAs when they operate in high-gain mode, thus degrading the receiver's effective dynamic range. In other words, such component mismatches can degrade the second order intercept point (IP2) of the receiver. To reduce this problem, the Background Art adaptively compensated for the device mismatches during manufacture of the handsets.

FIG. 6 illustrates a direct-conversion receiver 201, according to the Background Art.

In FIG. 6, receiver 201 includes an integrated circuit (IC) 200 and a second bandpass filtering circuit 205 (for brevity, a corresponding first BPF upstream from LNA 210 is not depicted). Bandpass filtering circuit 205 is external to IC 200. Typical components of bandpass filtering circuit 205, for example, include: a capacitor C1; a surface acoustic wave (SAW) type of bandpass filter; capacitors C2 and C3 connected between the SAW filter and the output nodes (nodes N4 & N6), respectively, of bandpass filtering circuit 205; inductors L1 & L2 connected between nodes N4 & N8 and node N6, respectively; and a capacitor C4 connected between node N8 and ground. The amplified high frequency signals on node N2 are provided to the SAW filter which provides filtered signals to capacitors C1 & C2.

IC 200 of FIG. 6 includes LNA 210, a block 220 representing parallel mixers, a block 230 representing parallel LPFs; a block 240 representing parallel VGAs; and a fuse array 260. During manufacture, a technician 266 uses an instrument 268 to measure the output impedance of mixer 220 and thereby assess the degree to which components of mixer 220 are mismatched. Based upon trial and error, the technician configures a fuse array 260 by which a compensating impedance is introduced that reduces the effect of the mismatched components.

SUMMARY OF THE PRESENT INVENTION

An embodiment of the present invention provides an apparatus for automatically selecting a compensation value usable to reduce a second order intermodulation (IM2) product in an output signal of a mixer. Such an apparatus may include: a mixer to output a mixed signal; a detector to detect an IM2 product in samples corresponding to the mixed signal; a compensation determination circuit to do the following automatically, to apply a plurality of candidate values of a mixer-control signal to the mixer, the mixer-control signal affecting a magnitude of an IM2 product in the mixed signal, to evaluate samples from the detector corresponding to the plurality, respectively, and to select one among the plurality candidate values as the compensation value.

An embodiment of the present invention provides a method for automatically selecting a compensation value usable to reduce a second order intermodulation (IM2) product in an output signal of a mixer. Such a method may include: providing samples corresponding to a mixed signal; detecting an IM2 product in the samples; performing the following automatically, applying a plurality of candidate values of a mixer-control signal to the mixer, the mixer-control signal affecting a magnitude of an IM2 product in the mixed signal, evaluating samples from the detector corresponding to the plurality, respectively, and selecting one among the plurality candidate values as the compensation value.

Additional features and advantages of the invention will be more fully apparent from the following detailed description of example embodiments, the accompanying drawings and the associated claims.

The remaining drawings are: intended to depict example embodiments of the invention and should not be interpreted to limit the scope thereof. The drawings are not drawn to scale.

Figure 1:
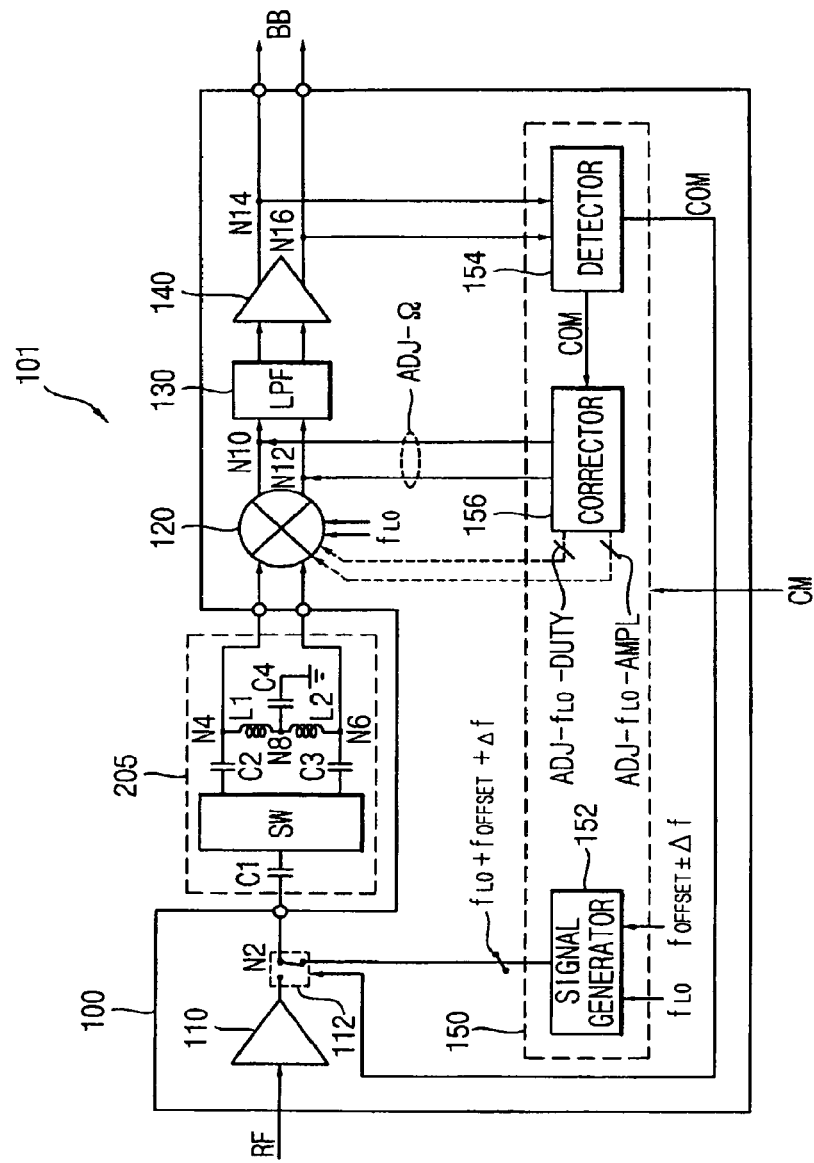

FIG. 1 illustrates a direct-conversion receiver 101, according to an embodiment of the present invention.

Figure 2:
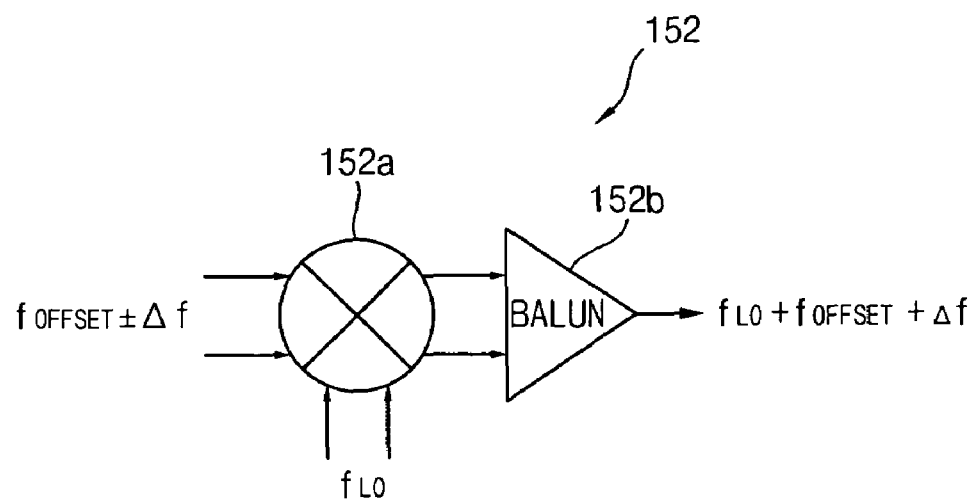

FIG. 2 illustrates an example of the signal generator circuit of FIG. 1, according to an embodiment of the present invention.

Figure 3:
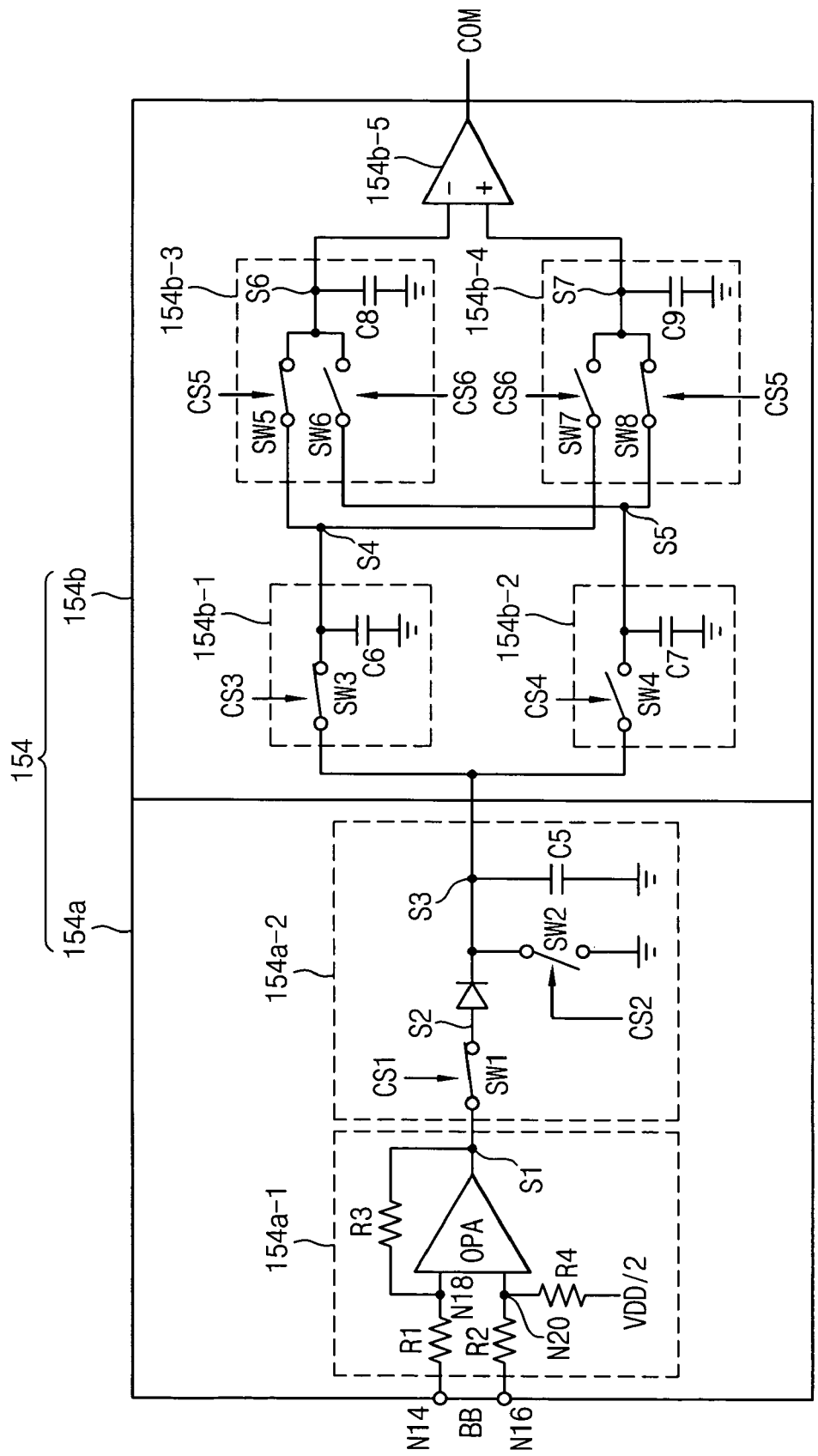

FIG. 3 illustrates an example of the detector circuit of FIG. 1, according to an embodiment of the present invention.

Figure 4:
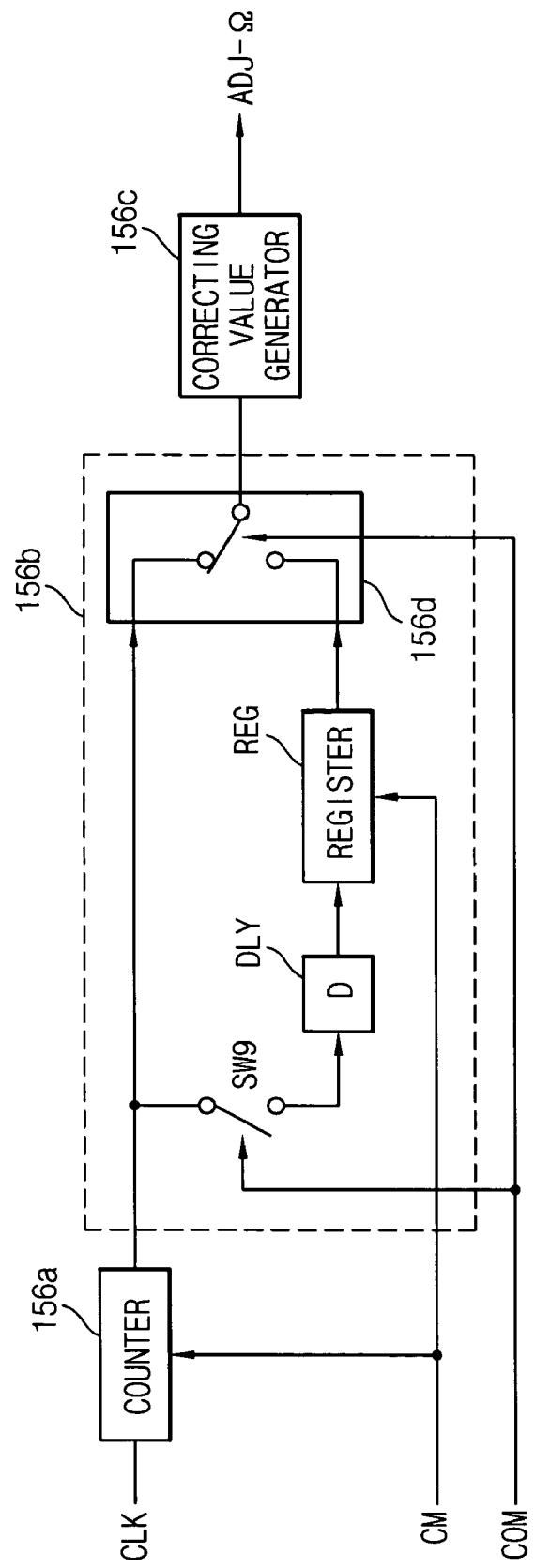

FIG. 4 illustrates an example of the corrector circuit 156 of FIG. 1, according to an embodiment of the present invention.

FIGS. 5a-5f are hypothetical sample waveforms produced by various components in the detector of FIG. 1, according to an embodiment of the present invention.

DETAILED DESCRIPTION OF EXAMPLE EMBODIMENTS

As part of developing the present invention, the following problems with the Background Art were identified. The compensating impedance provided after the configuration of fuse array 260 can reduce the effect caused by the mismatches that exist within IC 200, but can not compensate for the effects due to mismatches in the external bandpass filtering circuit 205. In addition, the compensation provided by fuse array 260 is fixed after manufacture of receiver 201 is completed, i.e., it cannot be changed to adaptively compensate as components within receiver 201 age and begin to exhibit different behavior. One or more embodiments of the present invention include features that address one or more of the above noted problems.

FIG. 1 illustrates a direct-conversion receiver 101, according to an embodiment of the present invention.

In FIG. 1, receiver 101 includes an integrated circuit (IC) 100 and a second bandpass filtering circuit 205 (for brevity, a corresponding first BPF upstream from LNA (again, low noise amplifier) 110 is not depicted). Bandpass filtering circuit 205 is external to IC 100. Typical components of bandpass filtering circuit 205 have been described above. Receiver 101 can be included, e.g., within a wireless telephony handset (or, in other words, a wireless mobile unit) having an antenna.

IC 100 of FIG. 1 can include LNA 110, a multiplexer (MUX) 112; a block 120 representing parallel frequency converters/translators, e.g., mixers; an automatic compensation circuit 150; a block 130 representing parallel LPFs; and a block 140 representing parallel VGAs. Automatic compensation ("auto-comp") circuit 150 can include: a signal generator 152; a detector circuit 154; and a corrector circuit 156.

Detector 154 outputs a comparison signal (COM) that causes MUX 112 to select the output of signal generator 152 rather than the received & band-pass-filtered high frequency signals RF. Signal generator 152 receives a local oscillator signal $f_{LO}$ and mixes it with, e.g., an offset signal $f_{offset}$ and a two-tone signal $\pm\Delta f$ to obtain an original test signal, which can be represented as follows:

$$f_{LO}+f_{offset}\pm\Delta f \qquad (1)$$

The original test signal is propagated through bandpass filtering circuit 205 (which, it is to be recalled, is external to IC 100) and then mixed at mixer block 120. The mixed test signals are passed to LPF block 130, and the filtered test signals are then amplified by VGA block 140 to form baseband signals BB (which can be decoded, e.g., by a modem). Detector 154 samples a distortion component, e.g., non-linear second order intermodulation distortion (IM2), in the amplified test signals output by VGA block 140. Detector 154 also compares the magnitude of a present sample against the magnitude of a previous sample to identify a change in slope of a sequence of samples. The indication of slope change is output as signal COM from detector circuit 154 to MUX 112 (as noted above) and to corrector circuit 156.

Also in response to a master control signal CM received by auto-comp circuit 150, corrector circuit 156 begins to provide a sequence of adjustment signals to nodes N10 and N12 connecting mixer block 120 to LPF block 130, respectively. Upon signal COM indicating that the slope has changed, two things occur: corrector circuit 156 selects the one among the sequence of adjustment signals that yielded the smallest value of the IM2 distortion component; and MUX 110 selects the output of LNA 110 rather than the original test signal from signal generator 152.

The adjustment signals output by corrector circuit 156 can take a variety of forms. For example, FIG. 1 depicts the adjustment signal as an impedance adjustment signal ADJ-Ω. Alternatively, corrector circuit 156 could output a local oscillator duty-cycle adjustment signal ADJ-$f_{LO}$-duty or a local oscillator amplitude adjustment signal ADJ-$f_{LO}$-AMPL. To increase the likelihood that changes in the adjustment signals will generate a monotonic decrease in the IM2 distortion component followed by a monotonic increase in the second order distortion component, only one of the types of adjustment signal should be output by corrector circuit 156. Alternatively, however, two or more types of adjustment signal could be output concurrently.

FIG. 2 illustrates an example of signal generator circuit 152, according to an embodiment of the present invention.

In FIG. 2, signal generator 152 includes a block 152a representing parallel frequency converters/translators, e.g., mixers. Mixer block 152a receives the two signals $f_{offset}\pm\Delta f$ and mixes them with two instances of local oscillator signal $f_{LO}$. Balun 152b, which receives a pair of mixed signals (a balanced input) from mixer block 152b, produces the original test signal (again, $f_{LO}+f_{offset}\pm\Delta f$). The original test signal represents an unbalanced signal.

FIG. 3 illustrates an example of detector circuit 154, according to an embodiment of the present invention. FIGS. 5a-5f are hypothetical sample waveforms produced by various components in detector 154, according to an embodiment of the present invention.

In FIG. 3, detector circuit 154 includes a peak-value detector 154a and a slope-change detecting circuit 154b. Detector circuit 152a includes an amplifying circuit 154a-1 and a peak-value sampling circuit 154a-2.

Baseband signals BB are received by amplifying circuit 154a-1 at nodes N14 and N16, respectively. Amplifying circuit 154a-1 includes: an operational amplifier (OPA) having inputs at nodes N18 and N20; and resistors R1 and R2 connected between nodes N14 & N16 and nodes N18 & N20, respectively. The output of the OPA is provided on node S1, which is fed back via a resistor R3 to the input at node N18. Node N20 is connected to a reference voltage, e.g., one-half of the supply voltage (½VDD) via a resistor R4.

Figure 5A:
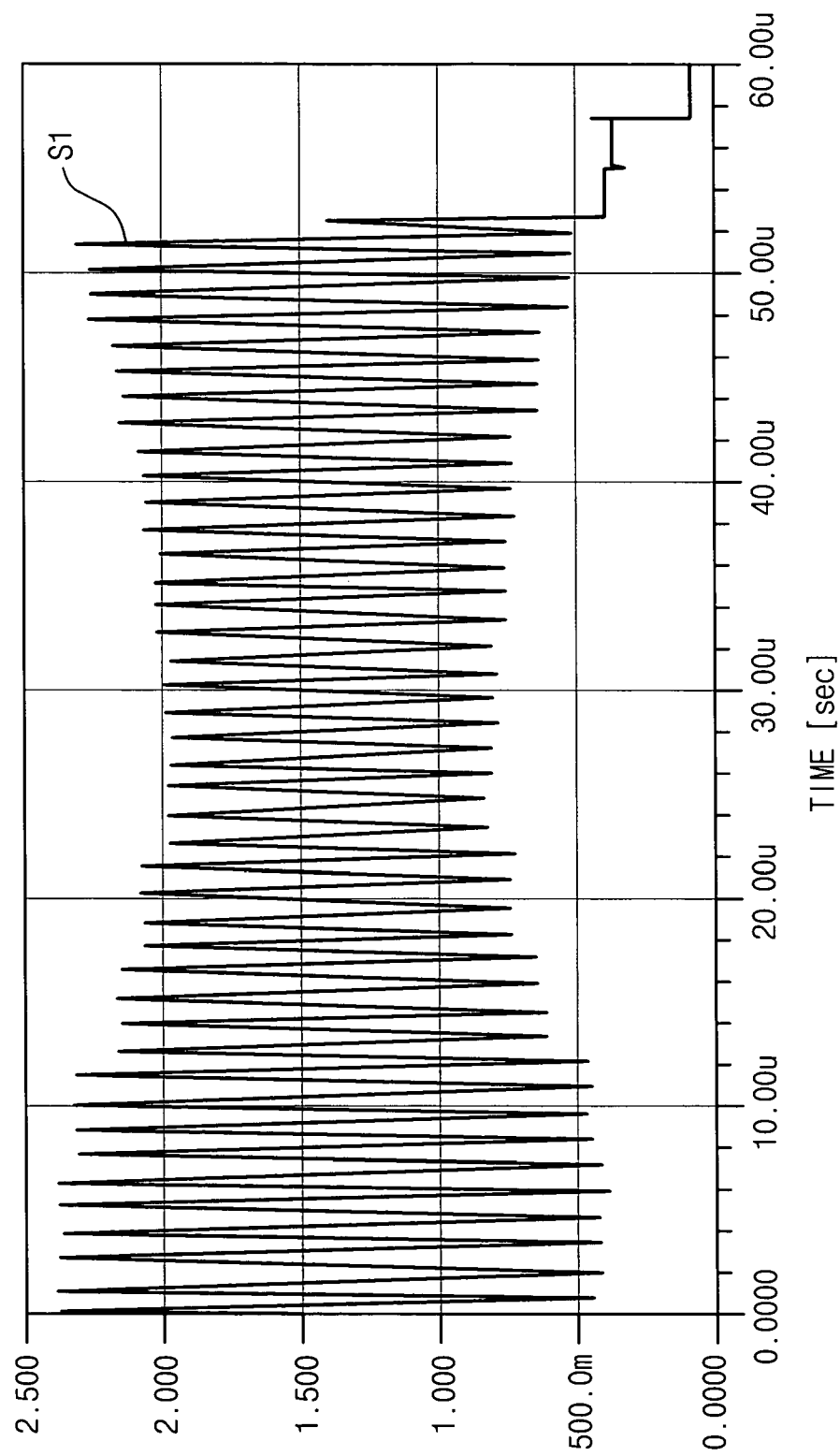

In operation, amplifying circuit 154a-1 converts a differential input signal (namely, baseband signals BB) into a single-ended signal. For example, the resultant single-ended signal on node S1 can have about twice the amplitude of either of the input signals on nodes N14 & N16. A hypothetical sample waveform of the signal on node S1 is depicted in FIG. 5a.

Peak-value sampling circuit 154a-2 includes a switch SW1; a diode; a switch SW2 and a capacitor C5. Node S1 represents the input and a node S3 represents an output of peak-value sampling circuit 154a-2. Nodes S1 and S3 are connected together via the diode. Switch SW1 and the diode are connected at a node S2. Node S3 is connected to ground via capacitor C5. Switch SW1 selectively connects node S1 to node S3 according to a switch control signal CS1 (for brevity, logic for generating switch control signal CS1 is not shown). Switch SW2 selectively connects node S3 to ground according to a switch control signal CS2 (for brevity, logic for generating switch control signal CS2 is not shown).

Figure 5B:
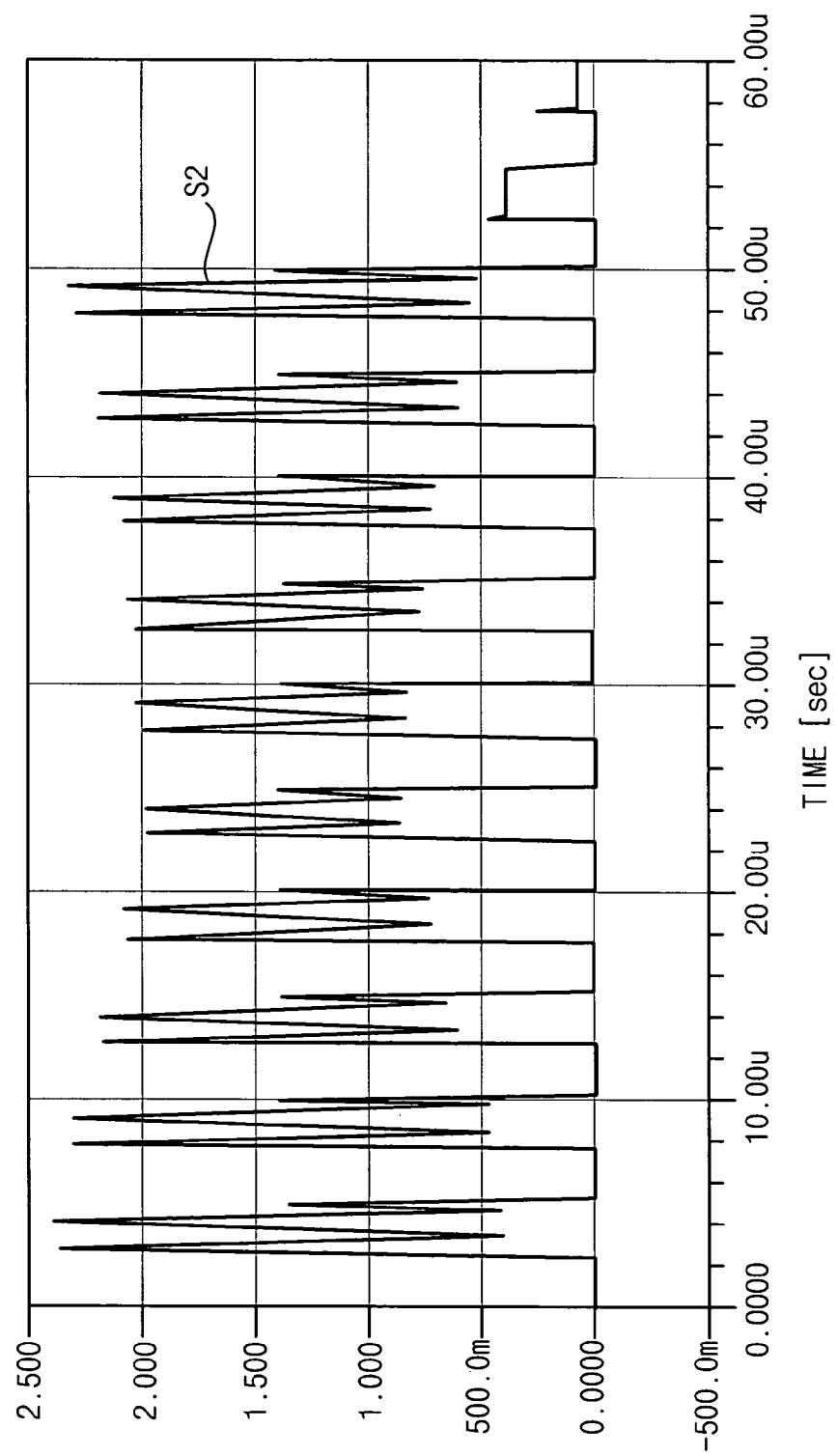

In operation, capacitor C5 of peak-value sampling circuit 154a-2 converts an AC signal on node S1 into DC signal on node S3. The signal on node S3 represents the sampled DC portion of the IM2 distortion component. Switch SW1 performs a sample & hold function. And switch SW2 performs a reset function that clears the sampled value held on node S3. A hypothetical sample waveform of the signal on node S2 is depicted in FIG. 5b. A hypothetical sample waveform of the signal on node S3 is depicted in FIG. 5c.

In FIG. 3, slope-change detecting circuit 154b includes: an odd sampling circuit 154b-1; an even sampling circuit 154b-2; a previous sample-selection circuit 154b-3; a present-sample selection circuit 154b-4; and a comparator 154b-5.

For odd sampling circuit 154*b*-1, node S3 represents the input and a node S4 represents the output that are selectively connected together by switch SW3 according to a switch control signal CS3 (for brevity, logic for generating switch control signal CS3 is not shown). Node S4 is connected to ground via a capacitor C6. For even sampling circuit 154*b*-2, node S3 also represents the input and a node S5 represents the output that are selectively connected together by switch SW4 according to a switch control signal CS4 (for brevity, logic for generating switch control signal CS4 is not shown). Node S5 is connected to ground via a capacitor C7.

Previous-sample selection circuit 154*b*-3 includes switches SW5 & SW6 that selectively connect nodes S4 & S5 to a node S6 according to switch control signals CS5 & CS6 (for brevity, logic for generating switch control signals CS5 & CS6 is not shown), respectively. Node S6 also is connected to the inverting input of comparator 154*b*-5. In addition, node S6 is connected to ground via a capacitor C8.

Present-sample selection circuit 154*b*-4 includes switches SW7 & SW8 that selectively connect nodes S4 & S5 to a node S7 according to switch control signals CS6 & CS5, respectively. Node S7 also is connected to the non-inverting input of comparator 154*b*-5. In addition, node S7 is connected to ground via a capacitor C9. Switch control signals CS6 & CS5 can be delayed versions of switch control signals CS3 & CS4, respectively.

Figure 5E:
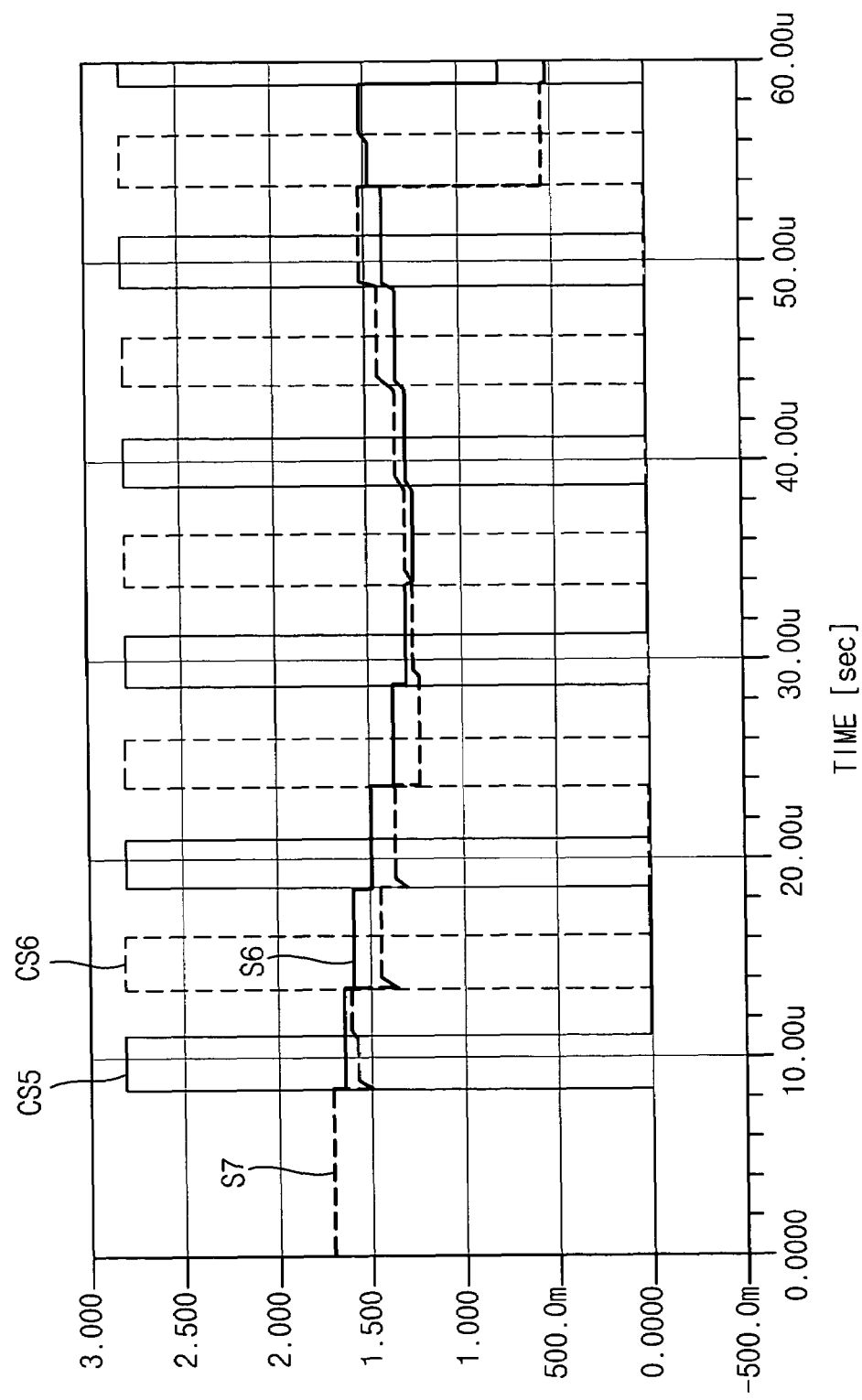

In operation, switch control signals CS3 & CS4 cause switches SW3 & SW4 to open/close in an alternating manner. When switch SW3 is open, switch SW4 is closed, and vice-versa. Similarly, switch pairs SW5 & SW7 and SW6 & SW7 are caused to open/close in an alternating manner by switch control signals CS5 and CS6. As a result, the older of the two samples provided by sampling circuits 154*b*-1 & 154*b*-2 is always provided to the inverting input of comparator 154*b*-5. And the younger (more recent) of the two samples provided by sampling circuits 154*b*-1 & 154*b*-2 is always provided to the non-inverting input of comparator 154*b*-5. Hypothetical sample waveforms of the signals on nodes S4 & S5, as well as sample waveforms for switch control signals CS3 & CS4 are depicted in FIG. 5*d*. Hypothetical sample waveforms of the signals on nodes S6 & S7, as well as sample waveforms for switch control signals CS5 & CS6 are depicted in FIG. 5*e*.

Figure 5F:
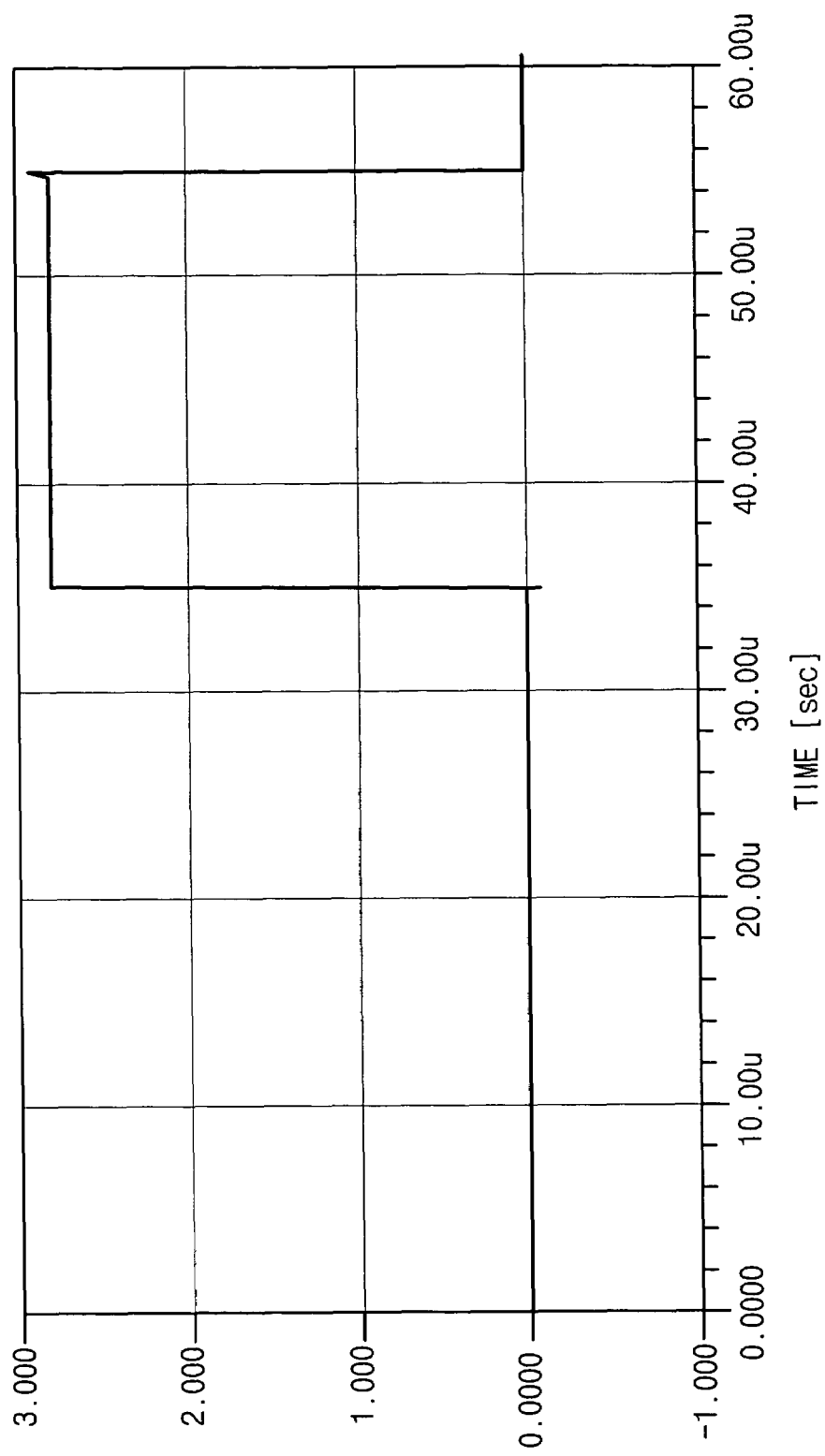
Figure 6:
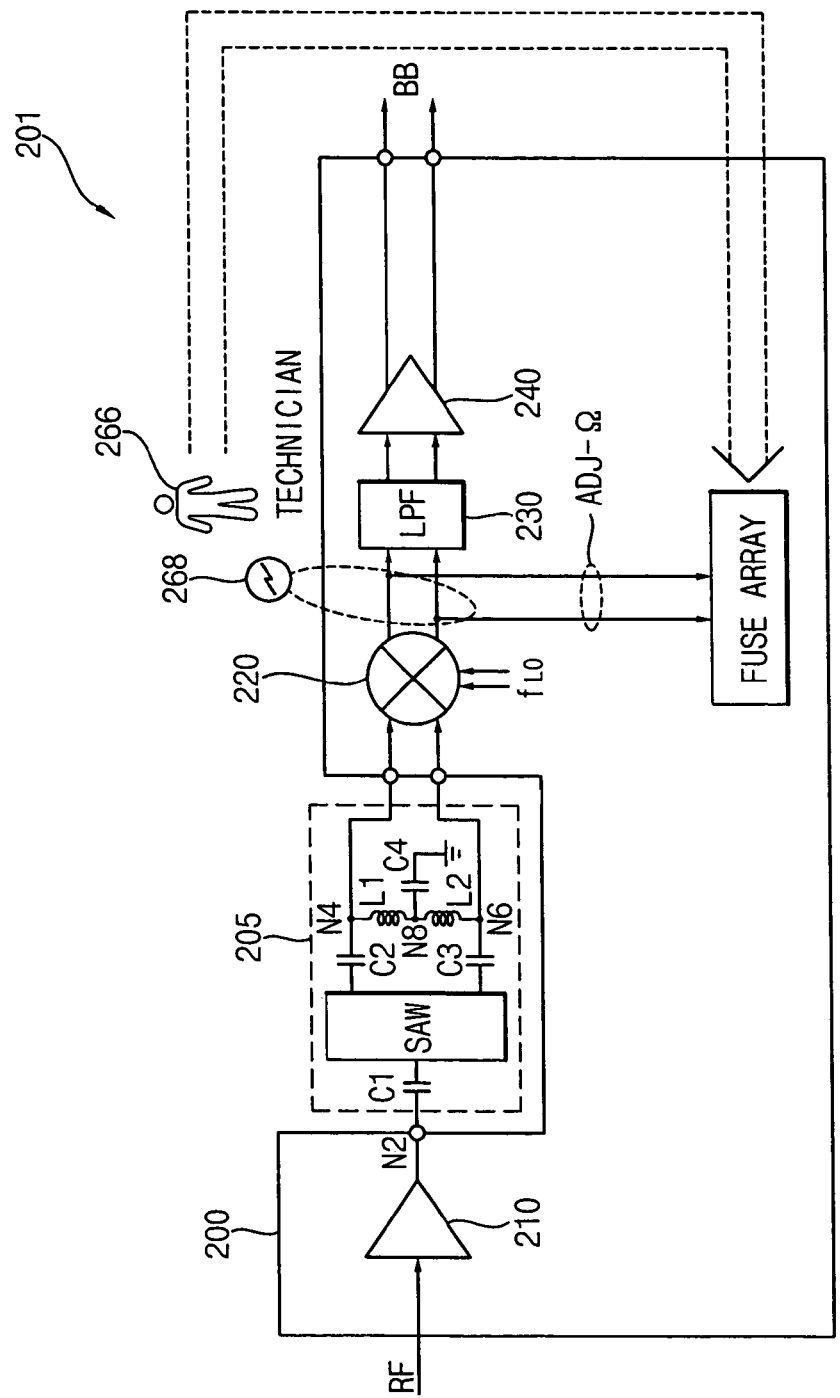
FIG. 6 illustrates a direct-conversion receiver, according to the Background Art.

The operation of corrector circuit 156 at first incrementally and monotonically reduces a magnitude of IM2 (whose DC component, again, is manifested on node S3). As such, the output of comparator 154*b*-5 (namely, signal COM) typically will not change at first. Then, after a minimum value for the magnitude of IM2 has been passed by or overshot, corrector circuit 156 will incrementally and monotonically increase a magnitude of IM2 (whose DC component, again, is manifested on node S3). Once the magnitude of the younger (more recent) sample of node S3 becomes greater than the older sample of node S3, then the output of comparator 154*b*-5 will change, i.e., signal COM will change. A hypothetical sample waveform of signal COM illustrating just such change is illustrated is depicted in FIG. 5*f*.

FIG. 4 illustrates an example of corrector circuit 156, according to an embodiment of the present invention.

In FIG. 4, corrector circuit 156 includes: a counter 156*a*; a count selection circuit 156*b*; and a correction value generating circuit 156*c*. Count selection circuit 156*b* includes: a switch SW9; a delay unit DLY; a memory device, e.g., a register, REG; and a MUX (again, multiplexer) 156*d*. Examples of correction value generating circuit 156*c* can be found in copending U.S. patent application having Ser. No. 11/013,092 (corresponding to U.S. Pre-Grant Publication No. US20050143044A1 and filed on Dec. 15, 2004) and copending U.S. patent application having Ser. No. 11/325,512 (which was filed on Jan. 5, 2006), the entirety of each of which is hereby incorporated by reference.

Counter 156*a* receives a clock signal CLK and is reset by master control signal CM. Register REG also receives, and its contents are cleared by, master control signal CM.

Switch SW9 selectively connects the count value output by counter 156*a* to delay unit DLY, according to the output of comparator 154*b*-5, i.e., signal COM. The value of the count can be described as a value of a code. Delay unit DLY passes its delayed count value to register REG where it is stored. MUX 156*d* selectively connects the output of counter 156*a* to correction value generator 156*c*, also according to signal COM.

In operation, before signal COM indicates a change in slope, switch SW9 and MUX 156*d* are controlled (by signal COM) to their first positions in which they select the count value produced by counter 156*a*. Due to delay circuit DLY, register REG will always hold the previous count value whereas MUX will transfer the present count value when switch SW9 and MUX 156*d* are in their first positions. Once signal come indicates a change in slope, switch SW9 and MUX 156*d* are controlled to their second positions in which: delay circuit DLY is disconnected from counter 156*a*; and MUX 156*d* selects the output of register REG.

Once signal COM indicates a change in slope due to the present count value, it should be understood that the previous count value then represents the desired count value. The present count value has passed by (or overshot) the count value that returns a minimum value for the magnitude of IM2. Hence, some logic is needed to recover the previous count value. That logic is provided by count selection circuit 156*b*.

One or more embodiments of the present invention include features that can reduce the negative effect caused by the mismatches that exist within IC 200 and/or the effects due to mismatches in the external bandpass filtering circuit 205, not only at the time of manufacture, but after manufacture of the receiver 201 has been completed and has begun to exhibit different behavior due to ageing. One or more embodiments of the present invention achieve such a reduction in the negative effects automatically, i.e., without requiring the involvement of a technician.

Of course, although several variances and example embodiments of the present invention are discussed herein, it is readily understood by those of ordinary skill in the art that various additional modifications may also be made to the present invention. Accordingly, the example embodiments discussed herein are not limiting of the present invention as defined by the associated claims.

What is claimed:

1. A calibration apparatus for automatically selecting a compensation value usable to reduce a second order intermodulation (IM2) product in an output signal of a mixer, the calibration apparatus comprising:
   a mixer to output a mixed signal;
   a detector to detect an IM2 product in samples corresponding to the mixed signal; and
   a compensation determination circuit to do the following automatically,
      to apply a plurality of candidate values of a mixer-control signal to the mixer, the mixer-control signal affecting a magnitude of an IM2 product in the mixed signal,
      to evaluate samples from the detector corresponding to the plurality of candidate values, respectively, and
      to select one among the plurality candidate values as the compensation value, wherein the detector includes,
an IM2 sampler to produce the samples corresponding to the mixed signal and to generate an indication of the magnitude of an IM2 product in the samples, respectively, and
a monotonicity change sensor to detect if there is a change in a monotonic progression of samples output by the IM2 sampler.

2. The calibration apparatus of claim 1, wherein the IM2 sampler includes:
a differential to single-ended signal converter to convert a differential signal into a single-ended version thereof; and
an AC/DC converter to convert the single-ended version of the differential signal into a DC signal; and
a sampling circuit to sample the DC signal.

3. The calibration apparatus of claim 1, further comprising:
a timing signal generator; and
wherein the monotonicity change sensor includes the following,
a first sample & hold (S&H) circuit to sample and hold a first value output by the IM2 sampler according to a first timing signal from the timing signal generator,
a second S&H circuit to sample and hold a second value output by the IM2 sampler according to a second timing signal from the timing signal generator,
a comparator, and
a switching circuit to selectively connect the older of the first value in the first S&H circuit and the second value in the second S&H circuit to a first input of the comparator, and to connect the younger thereof to a second input of the comparator;
wherein the timing signal generator is operable to cause the first and second S&H circuits to sample the output of the IM2 sampler on an alternating basis; and
wherein a change in the monotonic progression of samples output by the IM2 sampler is detected when an output of the comparator changes significantly.

4. The calibration apparatus of claim 1, further comprising:
a low pass filter to filter the mixed signal; and
an amplifier to amplify the filtered version of the mixed signal;
wherein the IM2 sampler is operable to sample the output of the amplifier.

5. The calibration apparatus of claim 1, wherein the compensation determination circuit includes:
a correction generator to generate the plurality of values of the mixer-control signal so as to variously affect a magnitude of an IM2 product in the mixed signal, respectively.

6. The calibration apparatus of claim 5, wherein the correction generator includes:
a code generator to generate a plurality of values of a code used to shape the mixer-control signal; and
a signal shaper to shape the mixer-control signal according to the values of the code, respectively.

7. The calibration apparatus of claim 6, wherein the code generator is a counter.

8. The calibration apparatus of claim 6, wherein the correction generator further includes:
a delay unit to delay an $i^{th}$ value of the code and so obtain an $(i-1)^{th}$ value of the code;
a memory to hold the $(i-1)^{th}$ value of the code; and
a switching circuit, responsive to detection of a change by the monotonicity change sensor, to apply the contents of the memory to the signal shaper.

9. The calibration apparatus of claim 1, further comprising:
a test signal generator to generate a test signal and to provide the same to a node which represents an external output terminal;
wherein the mixer is arranged to operate upon an externally sourced signal; and
the externally sourced signal is a version of the test signal.

10. The calibration apparatus of claim 9, wherein the version of the test signal is one that has propagated through a portion of a system external to the calibration apparatus but of which the calibration apparatus is a part.

11. The calibration apparatus of claim 9, wherein the test signal generator includes:
a mixer to mix a local oscillation signal and a two-tone signal and so obtain a precursor signal; and
a Balun circuit to unbalance the precursor signal and so obtain the test signal.

12. The calibration apparatus of claim 9, further comprising:
an amplifier to amplify a version of a signal from an antenna and to provide the amplified signal to the node.

13. The calibration apparatus of claim 1, wherein the calibration apparatus is formed as an integrated circuit.

14. The calibration apparatus of claim 1, wherein the mixer is arranged to operate upon a signal the source of which is external to the calibration apparatus or upon a version thereof.

15. A calibration apparatus for automatically calibrating a compensation value usable to reduce a second order intermodulation (IM2) product in an output signal of a mixer, the apparatus comprising:
a mixer to output a mixed signal;
an IM2 sampler to produce a sample corresponding to the mixed signal and to generate an indication of the magnitude of an IM2 product in the sample;
a monotonicity change sensor to detect if there is a change in a monotonic progression of samples output by the IM2 sampler; and
a correction generator to supply a plurality of values of a mixer-control signal to the mixer, the mixer-control signal affecting a magnitude of an IM2 product in the mixed signal.

16. A method for automatically selecting a compensation value usable to reduce a second order intermodulation (IM2) product in an output signal of a mixer, the method comprising:
providing samples corresponding to a mixed signal;
detecting an IM2 product in the samples;
performing the following automatically,
applying a plurality of candidate values of a mixer-control signal to the mixer, the mixer-control signal affecting a magnitude of an IM2 product in the mixed signal,
evaluating the samples corresponding to the plurality of candidate values, respectively, and
selecting one among the plurality candidate values as the compensation value,
wherein the step of detecting includes,
generating an indication of the magnitude of an IM2 product in the samples, respectively, and
detecting if there is a change in a monotonic progression of the samples.

17. The method of claim 16, wherein the generating step includes:
converting a differential signal into a single-ended version thereof;
AC/DC-converting the single-ended version of the differential signal into a DC signal; and
sampling the DC signal.

18. The method of claim 16, further comprising:
generating the plurality of values of the mixer-control signal so as to variously affect a magnitude of an IM2 product in the mixed signal, respectively.

19. The method of claim 18, wherein the generating step includes:
forming a plurality of values of a code used to shape the mixer-control signal; and
shaping the mixer-control signal according to the values of the code, respectively.

20. The method of claim 19, wherein the forming step includes counting a clock signal.

21. The method of claim 19, wherein the generating step further includes:
delaying an $i^{th}$ value of the code and so obtaining an $(i-1)^{th}$ value of the code;
storing the $(i-1)^{th}$ value of the code; and
selectively using, responsive to detection of a change in the monotonic progression, the stored $(i-1)^{th}$ value of the code.

22. A calibration apparatus for automatically selecting a compensation value usable to reduce a second order intermodulation (IM2) product in an output signal of a mixer, the calibration apparatus comprising:
a mixer to output a mixed signal;
a detector to detect an IM2 product in samples corresponding to the mixed signal; and
a compensation determination circuit to do the following automatically,
to apply a plurality of candidate values of a mixer-control signal to the mixer, the mixer-control signal affecting a magnitude of an IM2 product in the mixed signal,
to evaluate samples from the detector corresponding to the plurality of candidate values, respectively, and
to select one among the plurality candidate values as the compensation value,
wherein the compensation determination circuit includes,
a code generator to generate a plurality of values of a code used to shape the mixer-control signal,
a signal shaper to shape the mixer-control signal according to the values of the code, respectively,
a delay unit to delay an $i^{th}$ value of the code and so obtain an $(i-1)^{th}$ value of the code,
a memory to hold the $(i-1)^{th}$ value of the code, and
a switching circuit, responsive to detection of a change by a monotonicity change sensor of the detector, to apply the contents of the memory to the signal shaper.

23. A calibration apparatus for automatically selecting a compensation value usable to reduce a second order intermodulation (IM2) product in an output signal of a mixer, the calibration apparatus comprising:
a mixer to output a mixed signal;
a detector to detect an IM2 product in samples corresponding to the mixed signal;
a compensation determination circuit to do the following automatically,
to apply a plurality of candidate values of a mixer-control signal to the mixer, the mixer-control signal affecting a magnitude of an IM2 product in the mixed signal,
to evaluate samples from the detector corresponding to the plurality of candidate values, respectively, and
to select one among the plurality candidate values as the compensation value; and
a test signal generator to generate a test signal and to provide the same to a node which represents an external output terminal,
wherein the test signal generator includes,
a mixer to mix a local oscillation signal and a two-tone signal and so obtain a precursor signal, and
a Balun circuit to unbalance the precursor signal and obtain the test signal.

24. A method for automatically selecting a compensation value usable to reduce a second order intermodulation (IM2) product in an output signal of a mixer, the method comprising:
providing samples corresponding to a mixed signal;
detecting an IM2 product in the samples;
performing the following automatically,
applying a plurality of candidate values of a mixer-control signal to the mixer, the mixer-control signal affecting a magnitude of an IM2 product in the mixed signal,
evaluating the samples corresponding to the plurality of candidate values, respectively, and
selecting one among the plurality candidate values as the compensation value; and
generating the plurality of values of the mixer-control signal so as to variously affect a magnitude of an IM2 product in the mixed signal, respectively,
wherein the generating step includes,
forming a plurality of values of a code used to shape the mixer-control signal,
shaping the mixer-control signal according to the values of the code, respectively,
delaying an $i^{th}$ value of the code and so obtaining an $(i-1)^{th}$ value of the code,
storing the $(i-1)^{th}$ value of the code, and
selectively using, responsive to detection of a change in a monotonic progression of the samples, the stored $(i-1)$th value of the code.

* * * * *